United States Patent [19]

Koch et al.

[11] 3,958,124
[45] May 18, 1976

[54] METHOD AND APPARATUS FOR SEM SPECIMEN COATING AND TRANSFER

[75] Inventors: George R. Koch, Palo Alto; Carl T. Petersen, Livermore, both of Calif.

[73] Assignee: Etec Corporation, Hayward, Calif.

[22] Filed: Sept. 5, 1974

[21] Appl. No.: 503,226

Related U.S. Application Data

[62] Division of Ser. No. 398,101, Sept. 17, 1973, Pat. No. 3,858,049.

[52] U.S. Cl. .............................. 250/442; 250/311; 250/440
[51] Int. Cl.² ......................................... G21K 5/06
[58] Field of Search ................... 250/442, 440, 311

[56] References Cited
UNITED STATES PATENTS

| | | | |
|---|---|---|---|
| 3,150,259 | 9/1964 | Wilska | 250/442 |
| 3,185,840 | 5/1965 | Lemaitre | 250/442 |
| 3,405,264 | 10/1968 | Fairbanks et al. | 250/442 |
| 3,419,717 | 12/1968 | Mills | 250/442 |
| 3,426,193 | 2/1969 | Guernet | 250/442 |

Primary Examiner—Alfred E. Smith
Assistant Examiner—B. C. Anderson
Attorney, Agent, or Firm—Townsend and Townsend

[57] ABSTRACT

An improved method and apparatus for facilitating specimen handling during freezing, coating and transfer to and from the main chamber of an SEM. A unique specimen shuttle manipulable by a control rod permits transfer of a specimen between the main chamber and an auxiliary air lock chamber alternatively defined by an air lock housing and a coating apparatus housing. Either housing is removably attached to an entrance flange communicating via a gate valve assembly with the main chamber and is provided with a sealable access aperture for enabling transfer of both frozen and unfrozen specimens to and from the airlock chamber. The specimen manipulator enables specimen attachment and removal from the shuttle and has a frost shield for eliminating frost formation on the specimen surface during handling after freezing. The coating apparatus has a shuttle rotating platform and a removable oscillating filament assembly for enabling deposition of a layer of electrically conductive material on the specimen surface at the SEM site. A heat conducting path provides shuttle cooling in the main chamber to maintain a frozen specimen at a low temperature. The entrance flange is coupled to a vacuum pump to permit independent evacuation and backfilling of the airlock chamber in order to eliminate main chamber pressurization during specimen transfer.

6 Claims, 31 Drawing Figures

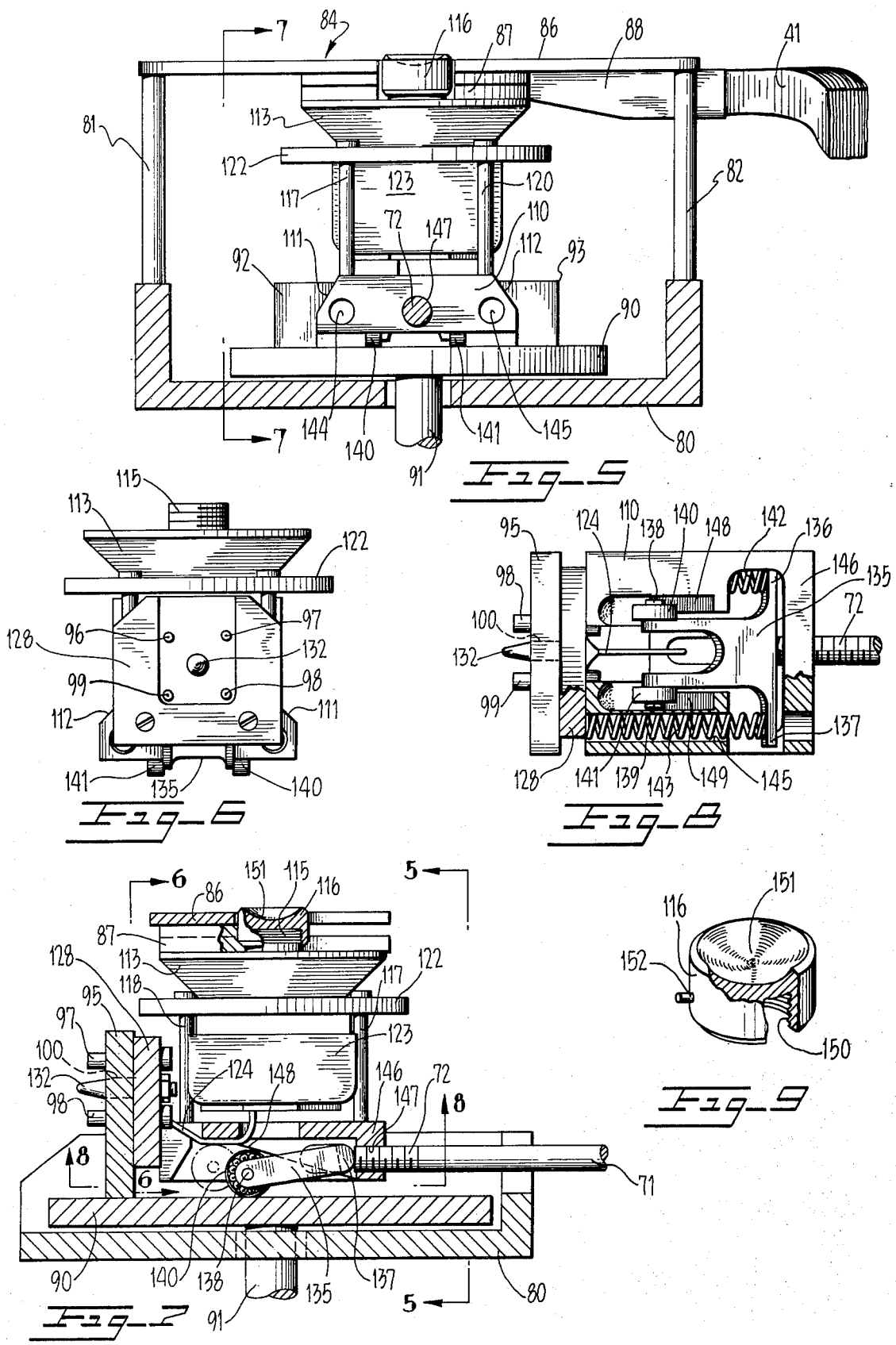

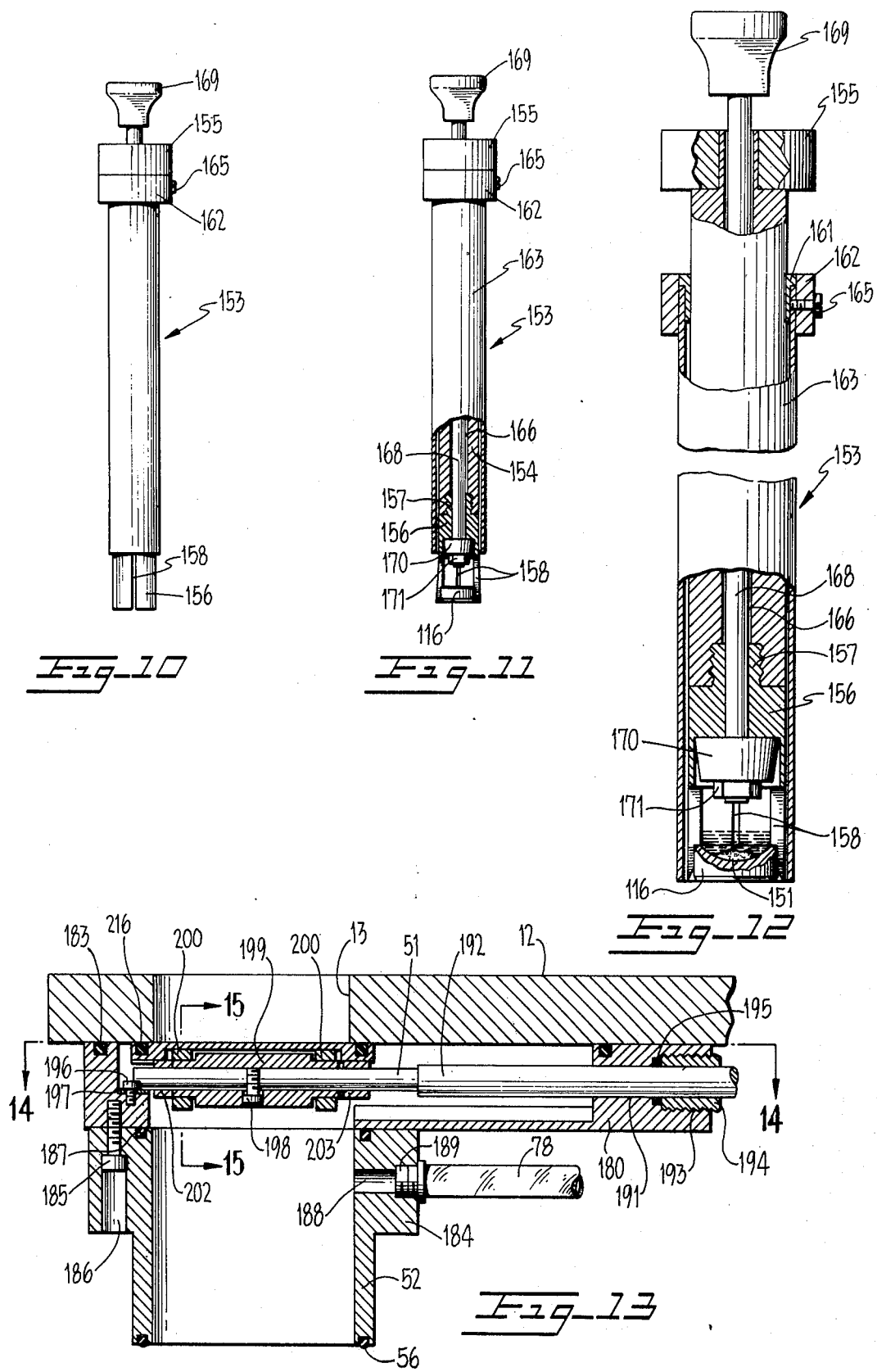

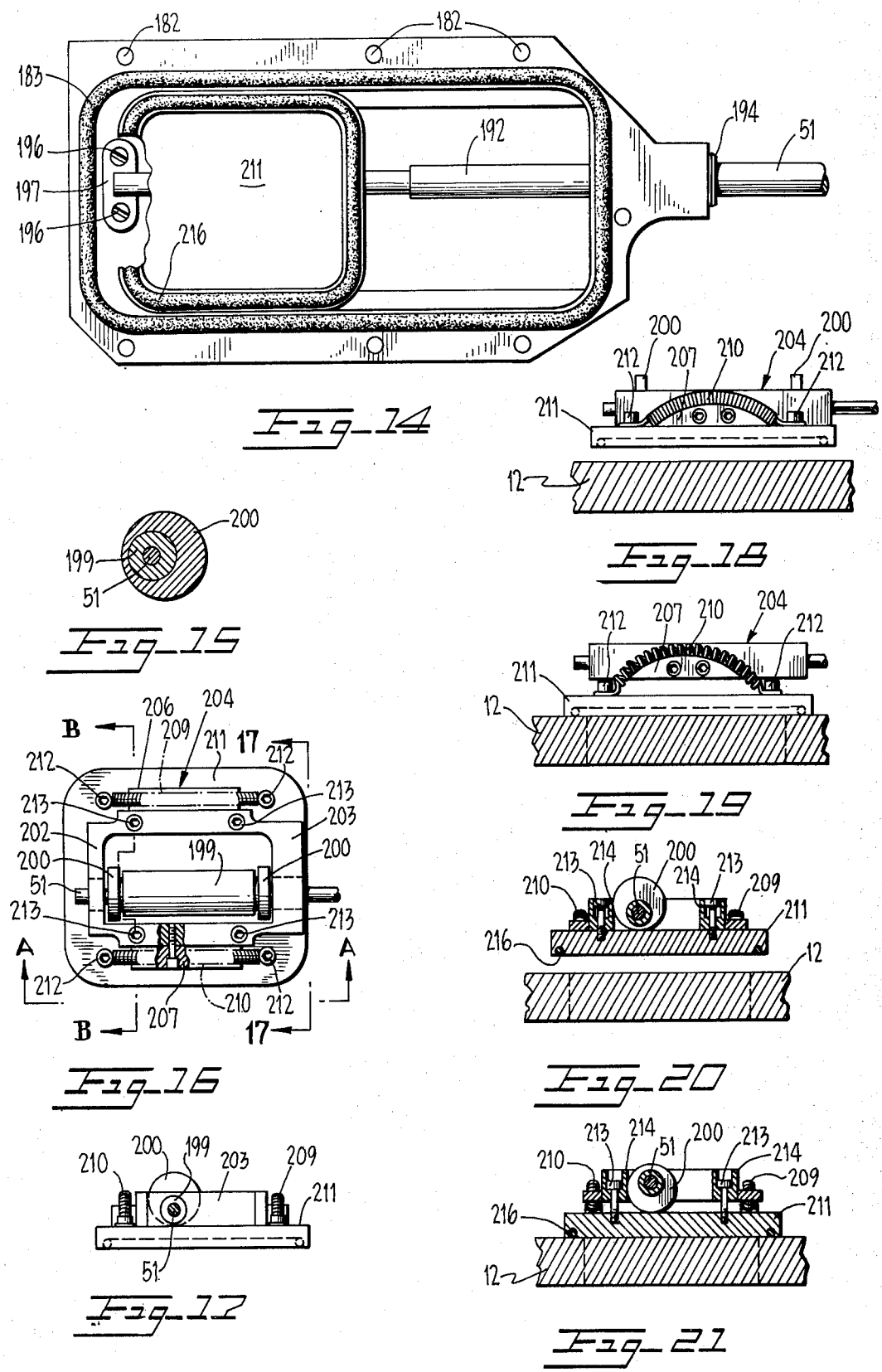

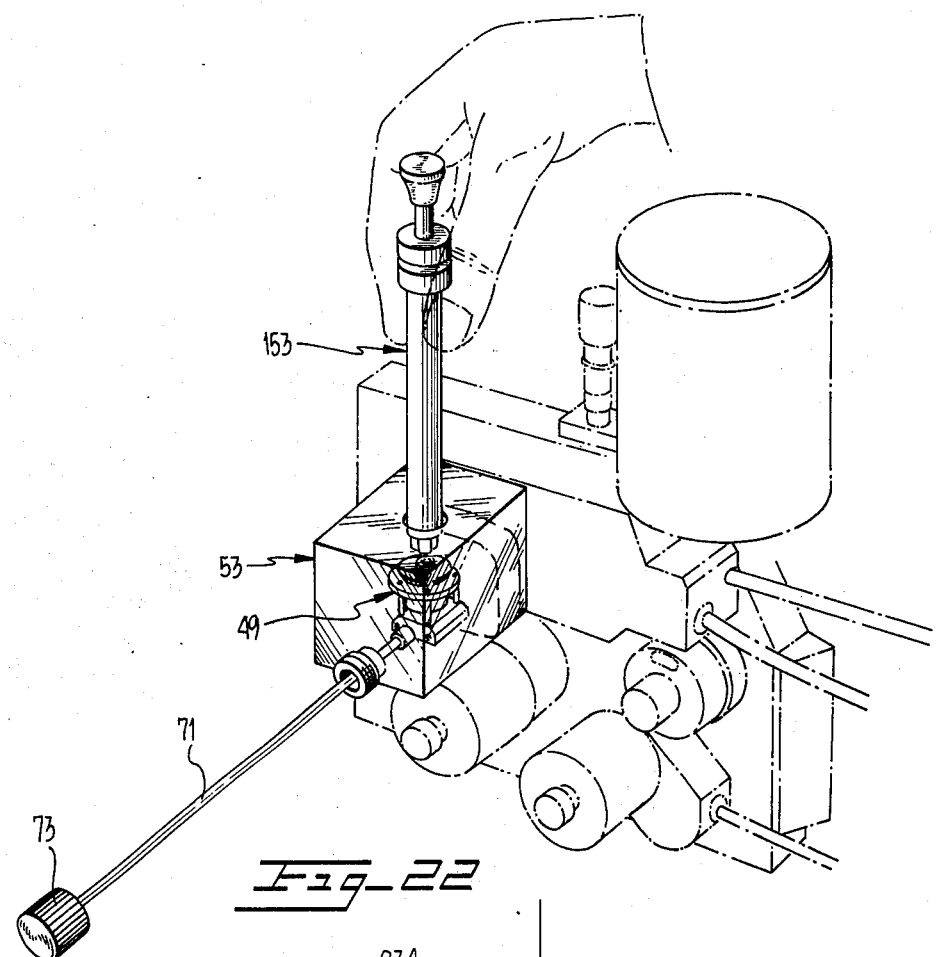
Fig_22
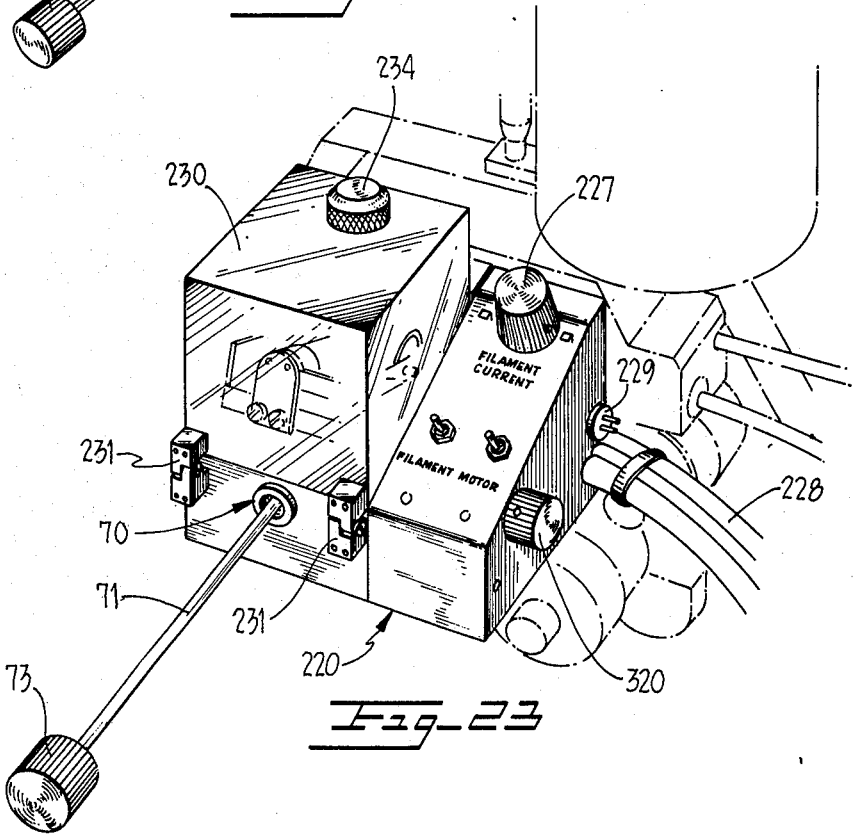
Fig_23

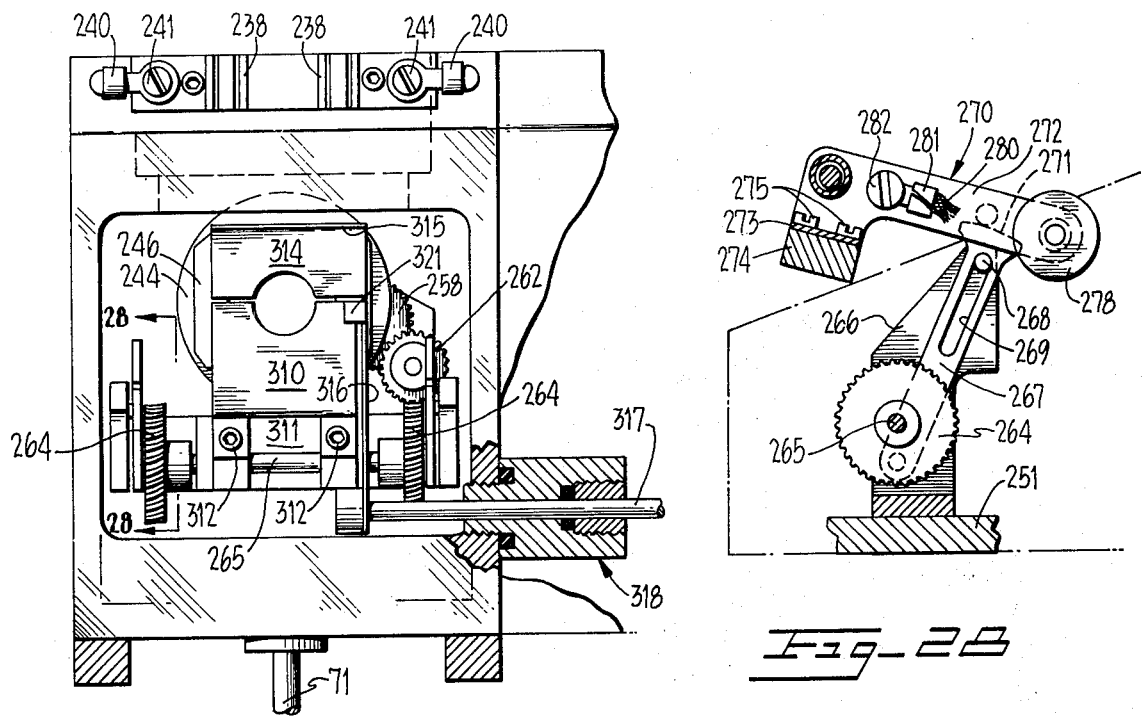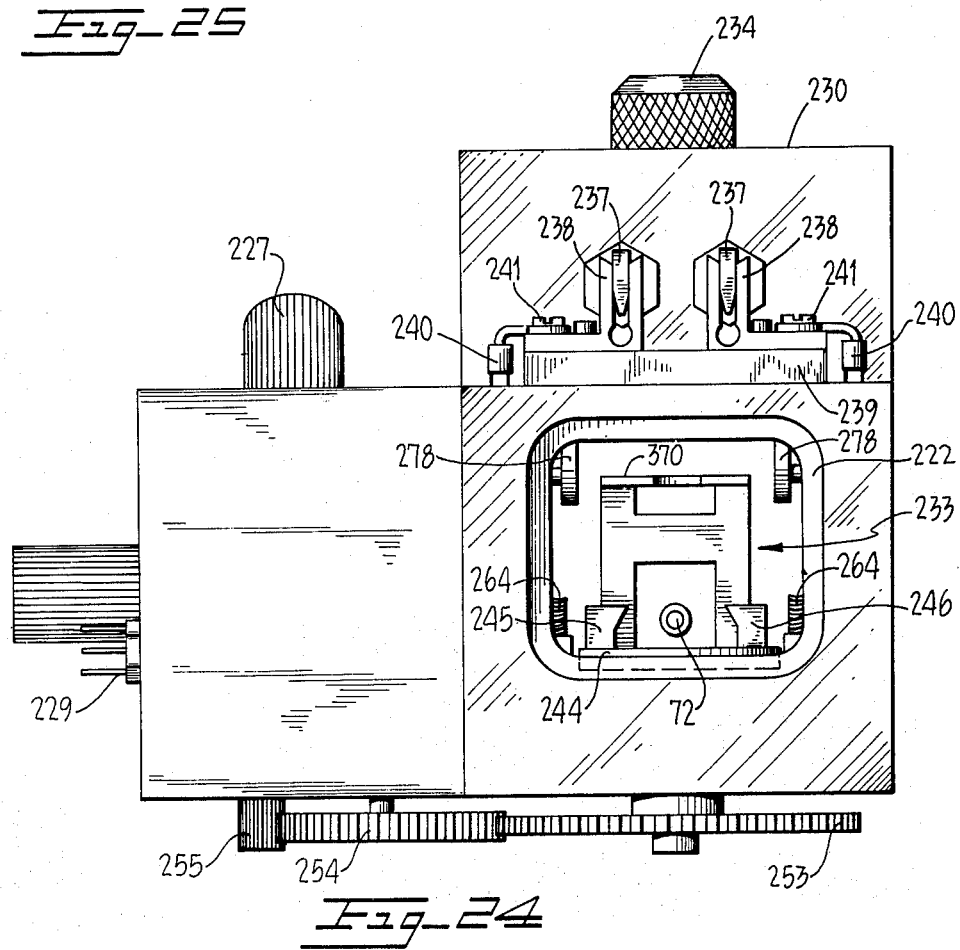

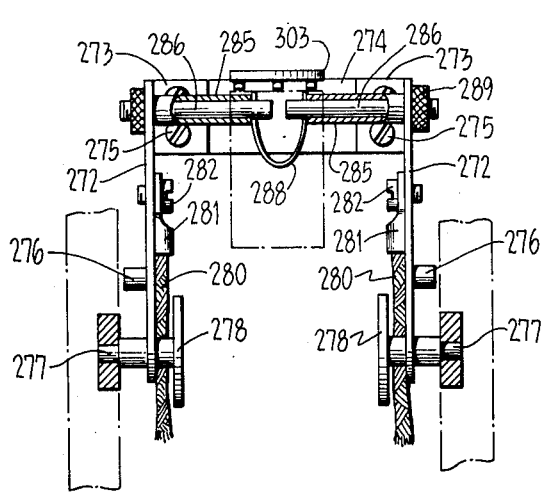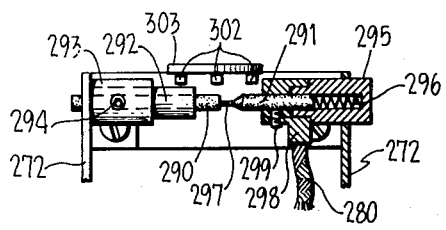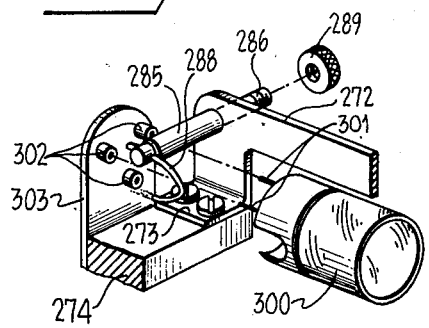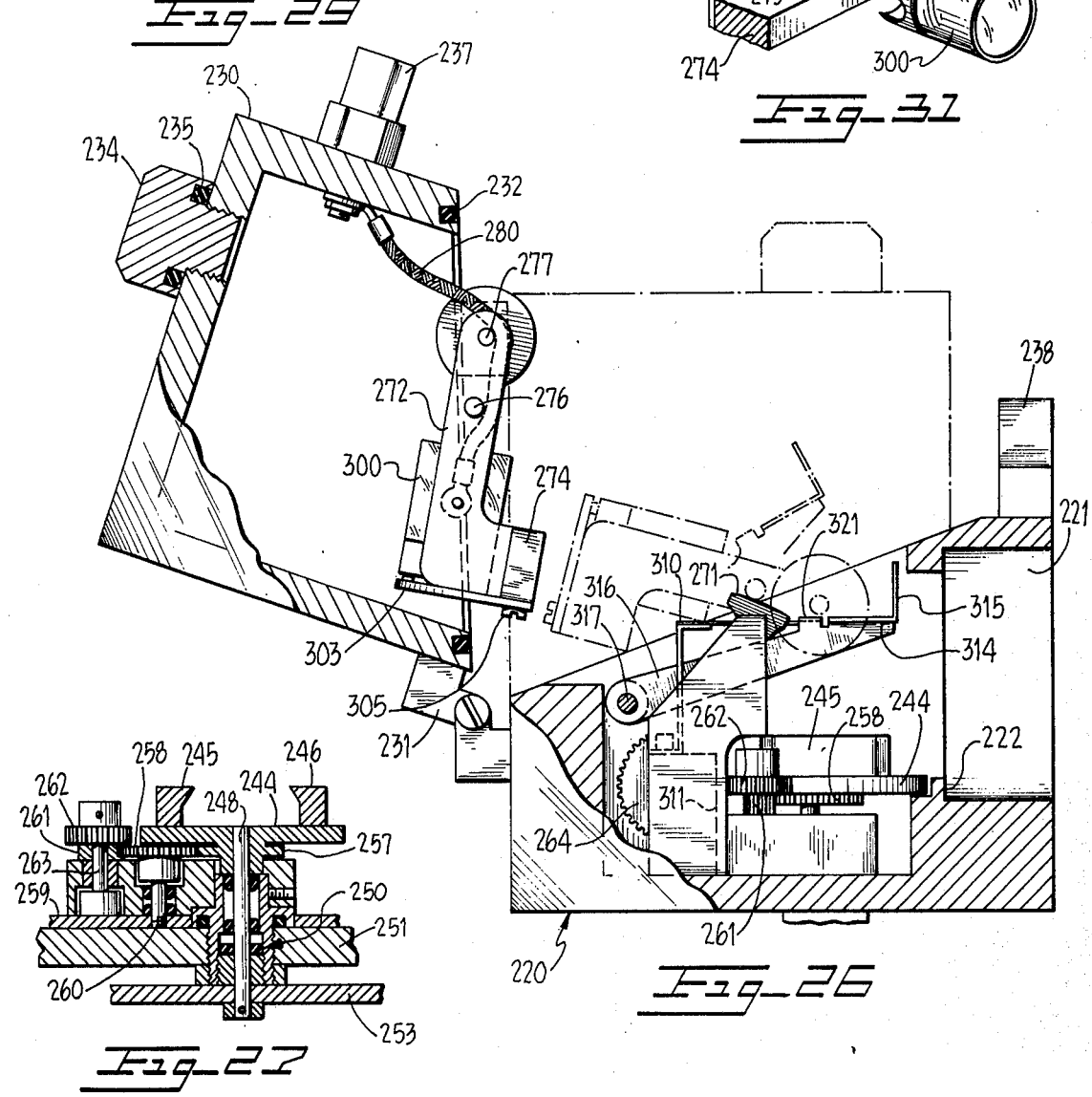

METHOD AND APPARATUS FOR SEM SPECIMEN COATING AND TRANSFER

CROSS REFERENCE TO RELATED CASES

This application is a divisional of U.S. application Ser. No. 398,101 filed Sept. 17, 1973 for METHOD AND APPARATUS FOR SEM SPECIMEN COATING AND TRANSFER now U.S. Pat. No. 3,858,049.

BACKGROUND OF THE INVENTION

This invention relates to improvements in the field of scanning electron microscopes. More particularly, in a first aspect this invention relates to apparatus and method for coating non-conductive specimens prior to examination in a scanning electron microscope, hereinafter designated an SEM. In another aspect, this invention relates to method and apparatus for facilitating the handling of both conductive and non-conductive specimens in an SEM.

SEM systems are known in which a specimen is placed on a mounting platform in an enclosed main chamber and investigated by scanning with an electron beam. Typically, fine vernier adjustments are mechanically linked to the platform so that the specimen may be precisely positioned with respect to the beam. Also, in a typical SEM system a vacuum pump is ordinarily provided for evacuating the main chamber after the specimen has been installed in order to provide a more favorable environment for the ensuing scanning. Thus, in a typical operation of known SEM systems, the specimen is first placed inside the main chamber, the chamber being entered through an access door having a vacuum seal, and the main chamber is pumped down to the desired low pressure by means of the vacuum pump. Since the volume of the main chamber is substantial, the scanning investigation cannot therefore proceed immediately after installation of the specimen in the main chamber, but must be delayed until such time as the vacuum pump is able to evacuate the chamber to the requisite subatmospheric pressure. This problem is compounded by the fact that the main chamber must be completely backfilled and then re-evacuated each time a previously installed specimen is removed after scanning and a new specimen is installed therein.

It is also frequently desirable when scanning certain types of specimens, particularly biological specimens, to perform the scanning process with the specimen held at an extremely low temperature of cryogenic order. In the past, this has been accomplished by first freezing the specimen with a low temperature cooling fluid in a tank located outside of the main chamber, and then inserting the frozen specimen into the main chamber onto the specimen platform. During the time that the frozen specimen is being transferred from the freezing solution to the platform, however, any contact, however momentary, with the ambient has been found to cause frost formation on the surface of the specimen. This surface layer of frost introduces inaccuracies in the scanning process and leads to inaccurate identification of the substances composing the specimen. While efforts have been made to shield a frozen specimen from the ambient until installation in the main chamber such efforts have not proven altogether effective in eliminating frost formation, particularly since the main chamber must of necessity be at ambient pressure during specimen installation.

In addition, once installed, the specimen must be maintained at the requisite low temperature in order to prevent un-freezing during the scanning process. Efforts to provide a workable cooling system to maintain the specimen in the frozen state have led to complicated, cumbersome and expensive arrangements which have not been found to be satisfactory to date.

Since the scanning process ordinarily requires a specimen that is electrically conductive, it is also frequently necessary to coat non-conductive specimens with some substance, such as gold, having good electrical conductivity. In known systems, the specimen is typically coated in a vacuum deposition coating device located outside and remote from the main chamber, and subsequently transferred thereto. In addition to the inconvenience of transferring the specimen to the site of the vacuum deposition apparatus for coating, and returning the coated specimen to the site of the SEM, the same severe problems of frost formation on a frozen coated specimen are encountered.

Efforts at providing SEM equipment which avoids the above-noted disadvantages have not met with wide success to date.

SUMMARY OF THE INVENTION

The invention comprises a method and apparatus for facilitating the handling of specimens throughout the SEM investigation process, particularly during specimen coating, freezing and transfer to and from the main SEM chamber prior to the initiation of the scanning process and after termination of the scanning process. In the preferred embodiment, an an airlock housing defining an airlock chamber and having a sealable access opening is installed on an entrance flange communicating with the main SEM chamber via a manually adjustable gate valve. The flange is provided with a bore outboard of the gate valve and communicating with a vacuum line coupled to the main SEM vacuum pump via a valve assembly to enable the airlock chamber pressure to be controlled independently of the main SEM chamber pressure. The airlock housing has a control rod slideably mounted therein for manipulating an unique specimen shuttle between the airlock chamber and the main SEM chamber, the control rod having an inner threaded end for releasable attachment to the shuttle. The specimen shuttle has an upper plate for mounting a mating specimen cap thereon, means providing a low friction support during transfer of the shuttle between the airlock chamber and the main chamber, and a means activated by removal of the control rod inner end for locking the shuttle to a mounting platform in the main SEM chamber. A high thermal conductivity heat conduction path leading from the specimen cap via the shuttle upper plate to a Dewar tank heat sink mounted exterior of the main SEM chamber maintains a mounted specimen at a desired low temperature when the shuttle is secured to the platform.

In another aspect of the invention, a compact specimen coating apparatus is provided which incorporates a housing defining an airlock chamber and a control rod for releasable attachment to the entrance flange and shuttle, respectively, as well as a coating device for depositing a coating of an electrically conductive substance on the surface of a specimen prior to installation of the specimen in the main chamber. The coating device includes a rotatable platform for rotating the specimen shuttle and cap and an oscillating easily removable filament assembly for providing uniform distribution of the conductive material over the specimen surface when the material is vaporized by electrical heating.

In still another aspect of the invention, a unique specimen manipulator is provided for facilitating specimen freezing and the loading and unloading of specimens mounted on the specimen cap onto the shuttle, the specimen manipulator incorporating slideable shield means for preventing frost formation on a frozen specimen during transfer to the shuttle.

The airlock housing and coating apparatus housing are both provided with an access bore sealed by a removable closure plug for enabling insertion of the manipulator into the housing interior to attach or remove a specimen cap from the shuttle.

To install a specimen in the main SEM chamber, the shuttle is first secured to the control rod of the airlock or coating apparatus housing and the housing is secured to the entrance flange with the shuttle positioned in the housing chamber. The housing closure plug is removed, a cap having a specimen mounted thereon is releasably secured to the working end of the manipulator, the manipulator is inserted into the housing chamber via the access bore and the cap is attached to the shuttle upper mounting plate. The manipulator is removed, the closure plug is replaced, the gate valve is opened and the shuttle is transferred to the main SEM chamber mounting platform after which the control rod is withdrawn, thereby locking the shuttle to the mounting platform, and the gate valve is closed. If the main SEM chamber is initially in the evacuated state, the specimen and shuttle may be installed and removed without disturbing the vacuum by evacuating the housing chamber via the flange bore before opening the gate valve.

When the specimen must be frozen before installation in the main SEM chamber, the shuttle is first transferred to the main SEM chamber mounting platform in the above-noted manner, locked therein and allowed to remain in this position for a requisite period of time required to cool the upper mounting plate to the desired low temperature via the heat conduction path. After the upper mounting plate has cooled, the shuttle is withdrawn into the airlock or coating apparatus housing in the above-noted manner. The working end of the manipulator with the specimen and cap attached thereto is then inserted into the Dewar tank with the frost shield in an open position, and the specimen and cap are submerged in the tank cooling fluid and retained in this position for a short period of time required to freeze the specimen. The shield is next moved to the closed position in which a pool of cooling fluid is trapped over the specimen, and the manipulator is removed from the Dewar tank and transferred over to the airlock or coating apparatus housing. The specimen cap is then attached to the shuttle and the shuttle is inserted into the main SEM chamber in the manner described above.

To coat a specimen, the coating apparatus is secured to the flange with the shuttle secured to the control rod and positioned in the housing chamber. A specimen and cap is then inserted into the housing chamber and secured to the shuttle in the above-noted manner. After removal of the manipulator and replacement of the closure plug in the access aperture, the housing chamber is evacuated and the coating device is actuated to deposit a layer of electrically conductive material on the surface of the specimen. After coating, the shuttle is transferred to the main SEM chamber in the normal way. If desired, the specimen may first be frozen before coating in the above-described manner.

For a fuller understanding of the nature and advantages of the invention, reference should be had to the ensuing detailed description taken in conjunction with the accompanying drawings.

BRIEF DESCRIPTION OF THE DRAWINGS

FIG. 3 is an enlarged detailed view illustrating the Dewar tank mount;

FIG. 5 is a front elevational view taken along lines 5—5 of FIG. 7;

FIG. 6 is a rear elevational view taken along lines 6—6 of FIG. 7;

FIG. 7 is a side elevational view taken along lines 7—7 of FIG. 5;

FIG. 8 is a bottom view partially broken away taken along lines 8—8 of FIG. 7;

FIG. 9 is a perspective view partially broken away of a specimen cap;

FIG. 10 is a side elevational view of a specimen manipulator;

FIG. 11 is a side elevational view partially broken away of a specimen manipulator showing the shield in the open position;

FIG. 12 is an enlarged elevational view partially broken away of the specimen manipulator showing the shield in the closed position;

FIG. 13 is a sectional view taken along lines 13—13 of FIG. 1 illustrating the gate valve assembly;

FIG. 14 is a rear elevational view taken along lines 14—14 of FIG. 13;

FIG. 15 is a sectional view taken along lines 15—15 of FIG. 13 showing an eccentric;

FIG. 16 is a front elevational view showing the gate valve and valve carriage;

FIG. 17 is a side elevational view taken along lines 17—17 of FIG. 16;

FIG. 18 is a side view partially in section taken along lines A—A showing the gate valve in the unsealed position;

FIG. 19 is a side elevational view partially in section taken along lines A—A showing the gate valve in the sealed position;

FIG. 20 is a sectional view taken along lines B—B showing the gate valve in the unsealed position;

FIG. 21 is a sectional view taken along lines B—B showing the gate valve in the sealed position;

FIG. 22 is a perspective view illustrating the attachment of a specimen cap to a shuttle located in the airlock chamber;

FIG. 23 is a perspective view illustrating an airlock coating apparatus;

FIG. 24 is a rear elevational view of the coating apparatus of FIG. 23;

FIG. 25 is a top plan view of the coating apparatus with the cover partially broken away;

FIG. 26 is a sectional view of the coating apparatus with the cover in the open position;

FIG. 27 is a sectional view illustrating the rotatable platform and gear train of the coating apparatus;

FIG. 28 is a detail view taken along lines 28—28 of FIG. 25 illustrating the filament assembly drive mechanism;

FIG. 29 is a detail view partially in section of a first embodiment of a filament assembly;

FIG. 30 is a detail view partially in section of an alternate embodiment of the filament;

FIG. 31 is a partial detail view in perspective illustrating the filament shield.

DESCRIPTION OF THE PREFERRED EMBODIMENTS

Figure 1:
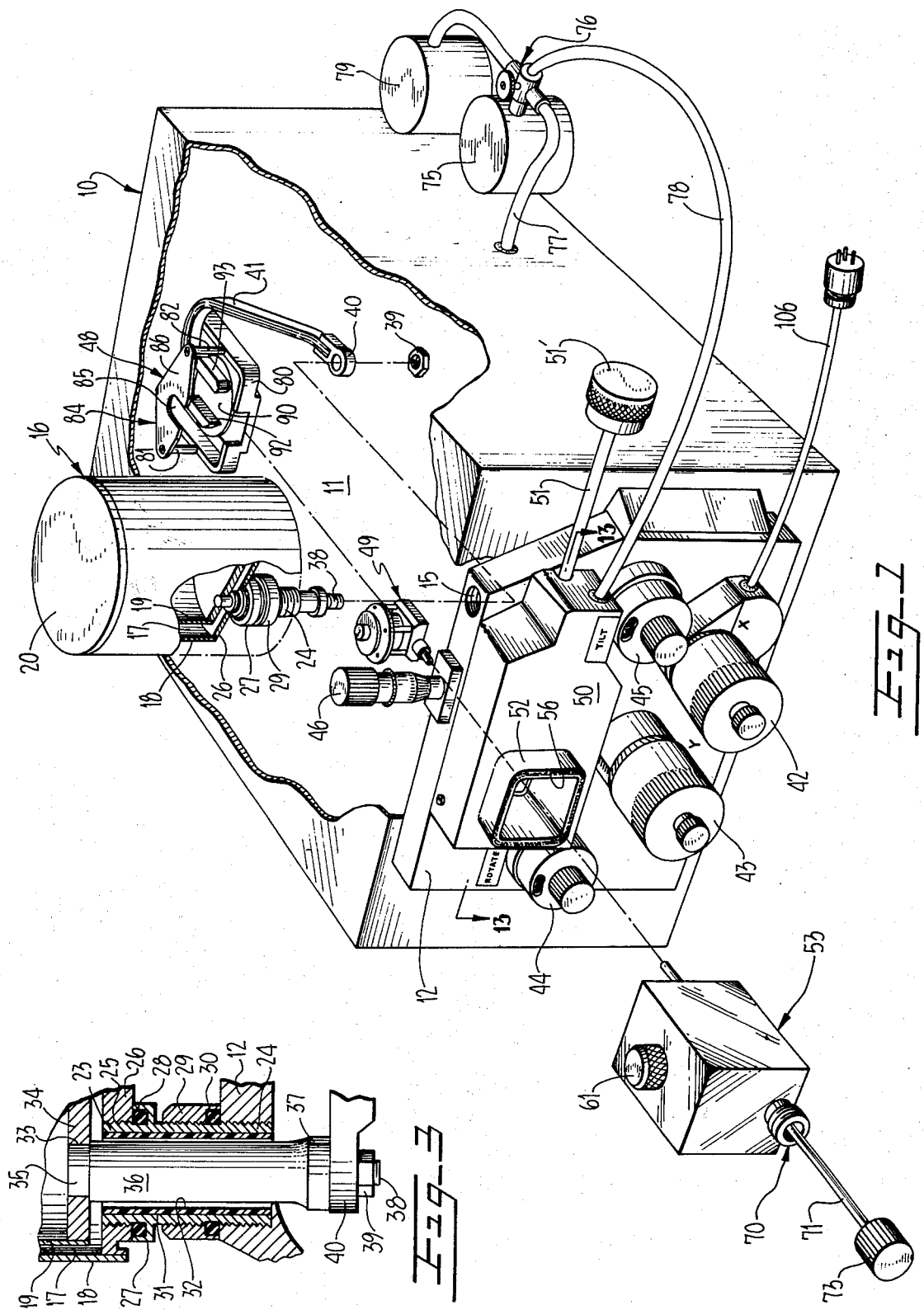
FIG. 1 is an exploded view in perspective of a main SEM chamber and portions of the invention.

Turning now to the drawings, FIG. 1 shows a housing 10 generally defining the main chamber 11 of an SEM. Associated with main chamber 11 is an electron beam generating and scanning device (not shown) which is mounted above chambeer 10 and provides a vertically disposed, downwardly directed scanning beam for investigating a specimen located in the chamber. Since this portion of the SEM is conventional, further details relating thereto which are unnecessary to an understanding of the invention have been omitted.

Figure 2:
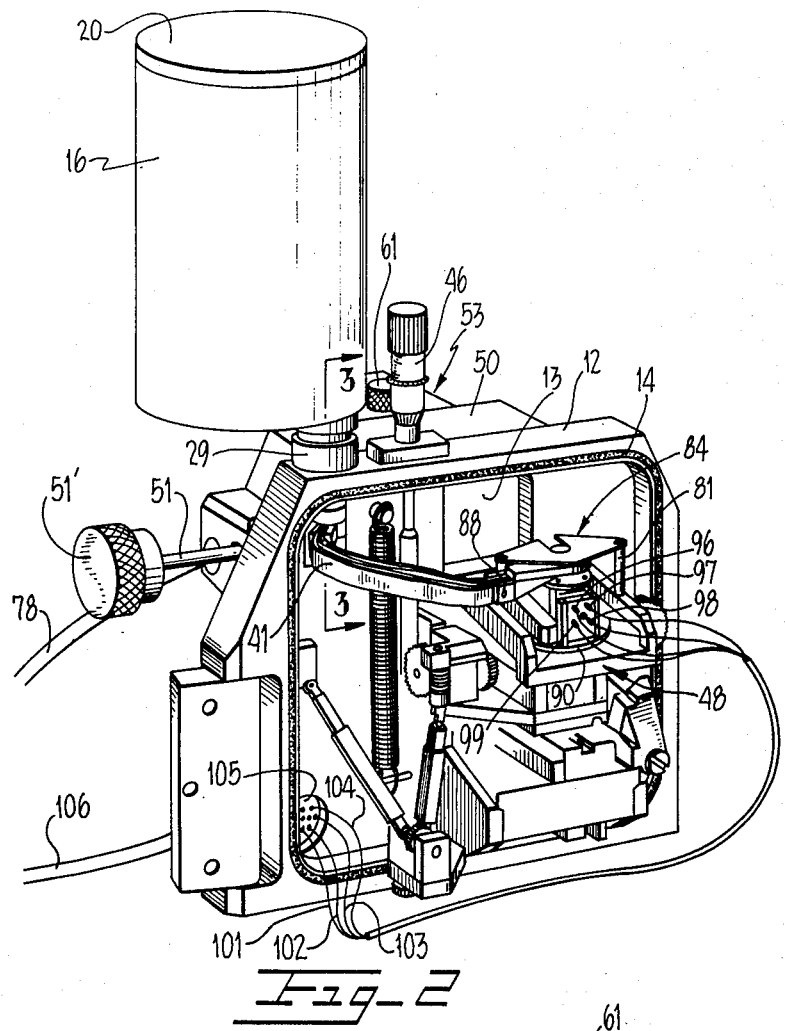
FIG. 2 is a perspective rear view of the FIG. 1 embodiment.

Mounted to the front wall of chamber 10 in sealing relation therewith is a member 12 commonly known as a stage door. As best shown in FIG. 2, stage door 12 has an access aperture 13 providing communication with main SEM chamber 11 and a peripheral seal 14 located in a groove in the inner wall surface thereof for effecting a vacuum seal with the front wall surface of housing 10. The upper surface of stage door 12 is provided with a vertically oriented internally threaded bore 15 providing a mounting means for Dewar tank 16. Dewar tank 16 is a double walled cylindrical tank having an insulating medial air space 17 separating outer wall 18 and inner wall 19. Dewar tank 16 is fitted with a cover member 20 to form an enclosed inner chamber for containing liquid nitrogen, Freon 14 or any other suitable low temperature cooling fluid.

As shown in detail in FIG. 3, Dewar tank 16 is coupled to stage door 12 by means of a generally cylindrical fixture 22 fabricated from an electrically insulative material and having upper and lower externally threaded ends 23, 24 respectively. Upper end 23 of fixture 22 is received in a threaded bore 25 in the lower wall 26 of Dewar tank 16. The upper portion of fixture 22 is also provided with a peripheral upstanding flange 27 forming a generally U-shaped channel sized to accomodate a sealing ring 28 which bears against the lower surface of bottom wall 26 in order to seal medial air space 17 from ambient. Similarly, the lower portion of fixture 22 is provided with an internally threaded collar 29 forming a downwardly opening generally U-shaped channel for receiving a seal 30 which contacts the upper surface of stage door 12 and provides a sealed joint therewith. Attached to an inner bore 31 of fixture 22 is an supporting liner 32 for providing additional structural support for fixture 22.

Secured to a bore 33 in inner bottom wall 34 of Dewar tank 16 is an upper end 35 of reduced diameter of a generally cylindrical heat conducting post 36. Post 36 is preferably fabricated from copper or other suitable material possessing high thermal conductivity. Post 36 has an outwardly flared bottom portion 37 providing a bearing surface and a threaded end portion 38 of reduced diameter adapted to receive a nut 39 in threaded engagement therewith for securing a clamp 40 between nut 39 and the aforementioned bearing surface. Clamp 40 comprises the terminal end of a heat conducting strap 41 described below.

A plurality of manually adjustable micrometers 42–45 are mounted on the front face of stage door 12 for enabling manual positioning along the X, Y, rotate and tilt axes of a shuttle platform 48 mounted within main SEM chamber 11. An additional micrometer 46 is mounted on the upper surface of stage 12 to provide a Z-axis adjustment for platform 48. As discussed more fully below, platform 48 is the mounting platform for a specimen shuttle 49 which carries the specimen to be examined.

A cover member 50 secured to the face of stage door 12 provides a housing for a manually operable gate valve assembly described in detail below with reference to FIGS. 13–21. The gate valve assembly provides a vacuum seal for access aperture 13 of stage door 12 and includes a control rod 51 having a knob 51' and a forwardly extending flange 52 forming an enclosed fluid-tight entrance channel leading to access aperture 13.

Figure 4:
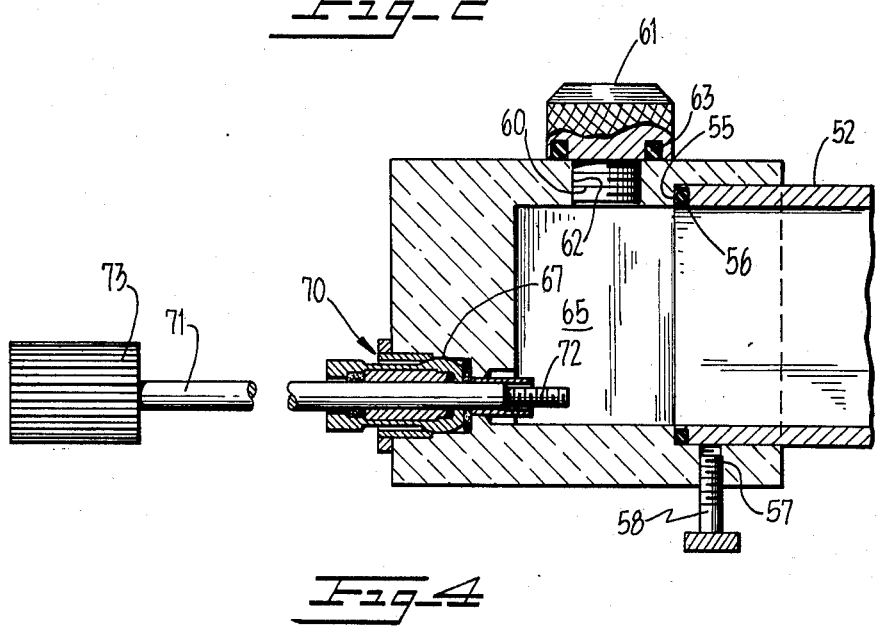
FIG. 4 is a sectional view illustrating the airlock housing feature.

As best shown in FIG. 4, flange 52 is dimensioned to accomodate the mouth of an airlock housing 53 preferably constructed from transparent material. Airlock housing 53 has an open end with an inner shoulder 55 for effecting a vacuum seal with a seal ring 56 received in a groove in the outer face of flange 52. Airlock housing 53 is also provided with a threaded bore 57 in the bottom wall thereof for receiving a set screw 58 which bears against the lower outer wall surface of flange 52 when housing 53 is received thereon to lock these two members together. Housing 53 is also provided with a threaded bore 60 in the upper wall thereof for receiving a removable closure cap 61 having an externally threaded lower portion 62. Closure cap 61 is also provided with a downwardly opening peripheral U-shaped channel for accomodating a seal ring 63 which seals the airlock chamber 65 from ambient.

Received in a bore 67 in the front wall of airlock housing 53 is a sealed control rod bearing assembly 70 for supporting a manually manipulable control rod 71 having a threaded inner end 72 and a control knob 73 secured to the outer end thereof. Rod bearing assembly 70 is a conventional unit which permits roll, pitch, yaw and axial movement of control rod 71 from the fully withdrawn position illustrated in FIG. 4 to a fully inserted position in which knob 73 is positioned adjacent the front face of airlock housing 53 and the threaded inner end 72 is located in main SEM chamber 11.

Referring to FIG. 1, a vacuum pump 75 is coupled via a conventional valve assembly 76 and conduits 77, 78 to main SEM chamber 11 and the interior of flange 52, respectively. A second pump 79 is also coupled to conduits 77, 78 via valve assembly 76. Pump 75 is used to evacuate main SEM chamber 11 and/or airlock chamber 65 in accordance with the setting of valve assembly 76. Pump 79 is used to backfill the respective chambers along conduits 77, 78 with air or an inert gas, such as dry Nitrogen. Elements 75–79 are conventional and are thus not further detailed.

As noted above, shuttle platform 48 is mounted within main chamber 11 in operative relationship with micrometers 42–46. With reference to FIG. 1, platform 48 has an irregularly shaped base member 80 with a pair of vertical support posts 81, 82 mounted on the sidewalls thereof for supporting an upper plate assembly 84 having a rearwardly extending central aperture 85 formed therein. As best shown in FIGS. 2, 5, and 7 plate assembly 84 comprises a top plate 86 and an underlying abutment member 87 secured thereto. Affixed to one side of abutment member 87 is a terminal clamp 88 secured to cold strap 41. Abutment member 87 and cold strap 41 are both fabricated from material such as copper having high thermal conductivity so that these elements can be maintained at an extremely low temperature by the contents of Dewar tank 16.

With reference to FIGS. 1, 2 and 5, positioned centrally of base member 80 is a rotatable platform 90 operatively coupled to ROTATE micrometer 44 via a shaft 91 and having a pair of substantially parallel mounting gibs 92, 93 with a pair of inner wall surfaces which are angled inwardly in the upward direction. Mounted on the rear surface of platform 90 is a socket plate 95 (FIGS. 2 and 7) having four electrical female terminals 96–99 and a centrally positioned guide aperture 100 (FIG. 7). A plurality of electrical of electrical conductors 101–104 are connected between terminals 96–99 and the terminals of a vacuum tight plug adapter 105. The plug adapter terminals in turn are coupled to remote circuitry (not shown) via cable 106.

As best shown in FIGS. 5–8, specimen shuttle 49 includes a base member 110 having a pair of sloping sidewalls 111, 112 which are angled inwardly in the upward direction conformably with the inner ways of gibs 92, 93. An upper mounting plate 113 having an externally threaded, upwardly extending central boss 115 for receiving a specimen cap 116 is supported above base member 110 by four vertically disposed posts 117–120. Upper plate 113 is preferably fabricated from a material such as copper which possesses high thermal conductivity. Suspended below upper plate 113 by means of a thermally insulated spacer 122 is a housing 123 for enclosing a heating coil (not shown). The electrical leads 124 from the coil are connected to a first pair of terminal pins 126, 127 mounted in an electrically insulated support plate 128 which is attached to base member 110 in any suitable fashion. A second pair of electrical terminals 129, 130 are provided in support plate 128 for furnishing electrical connections to a thermocouple (not shown) which is mounted upper plate 113 adjacent specimen cap 116 and used to monitor specimen temperature. Extending from support plate 128 is a tapered locater pin 132 for providing a guide to facilitate insertion of terminal pins 126, 127, 129, 130 in female terminals 96–99 in socket plate 95.

Mounted in a recess in base member 110 is a retractable wheel assembly which includes a $\pi$ — shaped yoke 135 having a pair of laterally extending arms 136, 137 and a pair of spindles 138, 139 each carrying a rotatable low friction bearing wheel 140, 141. A pair of springs 142, 143 mounted in spaced parallel bores 144, 145 extending longitudinally of the sidewalls 111, 112 of base member 110 are biased against lateral arms 136, 137 of yoke 135 to provide a force tending to urge yoke 135 toward front wall 146. A threaded bore 147 located centrally in front wall 146 of base member 110 is provided for receiving the threaded end 72 of control rod 71. A pair of upwardly extending angled ramps 148, 149 formed in base member 110 provide guideways for wheels 140, 141. Thus, whenever control rod 71 is withdrawn, yoke 135 is translated to the extreme forward position shown in full in FIGS. 5–8 by springs 142, 143, and wheels 140, 141 are extended to the fully extended position shown in full by ramps 148, 149. When control rod 71 is advanced to the other extreme position shown in phantom in FIG. 7, yoke 135 is translated to the extreme rearward position and wheels 140, 141 are retracted by the combined action of the working end of control rod 71 and springs 142, 143 acting on the inner flats of laterally extending yoke arms 136, 137.

Specimen cap 116 shown in perspective in FIG. 9 has an internally threaded bore 150 for enabling specimen cap 116 to be secured to boss 115 on upper plate 113 of shuttle 49, and an upper surface 151 for receiving a specimen. Preferably, specimen mounting surface 151 is concave as shown. Extending radially of the sidewall of specimen cap 116 is a pin 152 for enabling cap 116 to be attached and removed from threaded boss 115 by means of a specimen manipulator 153 shown in FIGS. 10–12 and described below. Specimen cap 116 is preferably fabricated from copper or other equivalent material exhibiting high thermal conductivity. As shown in FIG. 7, when specimen shuttle 49 is positioned within gibs 92, 93 on platform 90 and control rod 71 is withdrawn to the position illustrated in full, wheels 140, 141 are fully extended. In this position, shuttle 49 is urged upwardly with sufficient force to effect rigid frictional contact between gibs 92, 93 and sidewalls 111, 112 and between the upper surface of upper plate 113 and the lower surface of abutment member 87. The latter insures highly effective thermal contact between abutment member 87 and upper plate 113 so that a good thermal conduction path is maintained from the specimen to Dewar tank 16. The combination of the two frictional forces insures rigid mounting of shuttle 49 on platform 90 to maintain positional stability of the specimen in main chamber 11.

FIGS. 10–12 show a specimen manipulator 153 which facilitates specimen handling and transfer of a specimen mounted on specimen cap 116 to and from specimen shuttle 49. Specimen manipulator 153 includes an inner cylindrical core member 154 having an upper end of narrowed diameter with a collar 155 secured thereto and a slotted expandable collet 156 secured to the lower end thereof by means of a threaded connection 157. The lower inner diameter of collet 156 is dimensioned to provide a frictional fit with the outer diameter of specimen cap 116. An outer shield 160 is slideably received about inner core member 154 and includes an upper spacer 161, a surrounding collar 162 and a thin walled cylindrical tube 163 secured to spacer 161 by a set screw 165. Slideably received in a central bore 166 of inner core member 154 is a release rod 168 having a release knob 169 mounted on the upper end, and a lower camming block 170 secured to the lower end of rod 168 by means of a nut 171. As best shown in FIG. 12, camming block 170 has a frusto-conical shape providing a camming surface adapted to bear against an inner shoulder of collet 156 to temporarily expand the diameter thereof when urged in the downward direction by manual pressure on release knob 169.

In use, a specimen is mounted on mounting surface 151 of specimen cap 116 and collet 156 is pressed over specimen cap 116 with pin 152 engaged in one of the collet slots 158. The specimen cap 116 may now be lifted and mainpulated in any desired manner. To release specimen cap 116, release knob 169 is pressed downwardly to spread collet 156, thereby releasing specimen cap 116.

FIGS. 13–20 illustrate the gate valve assembly used to control access to the main SEM chamber 11 via access aperture 13 in stage door 12. A base plate 180 is provided with a peripheral mounting flange 181 having mounting bolt apertures 182 for enabling base plate 180 to be secured to the outer surface of stage door 12 by conventional mounting bolts (not shown). A seal ring 183 is mounted in a peripheral groove formed in the inner base plate 180 to provide a vacuum seal with the outer stage wall within the region interior to the seal ring 183.

A tunnel member 184 having flange 52 integrally formed therewith is mounted on the outer surface of base plate 180 by means of a plurality of conventional cap screws 185 (only one of which is shown), each received in a separate bore 186. A seal ring 187 similar to seal ring 183 is secured in a groove formed in the inner surface of tunnel member 184 to provide an air tight seal with the outer surface of base plate 180. Tunnel member 184 is provided with a fluid bore 188, the outer portion of which is threaded to receive a vacuum hose fitting 189. Vacuum line 78 is attached to fitting 189.

The right hand wall portion of base plate 180 is provided with a bore 191 for accomodating an enlarged diametral portion 192 of gate valve control rod 51. Bore 191 in base plate 180 is provided with a threaded counter bore 193 for receiving an externally threaded bearing member 194 and a sealing ring 195. Bearing member 194 provides axial support for enlarged portion 192 of gate valve control rod 51. Secured to a stepped portion of base plate 180 by means of a pair of bolts 196 is a bearing plate 197 for providing a bearing support to the free end of control rod 51 when this element is in the closed position.

Secured to the free end of control rod 51 by means of a set screw 198 is a cylindrical bearing mount 199 having opposite end portions of reduced diameter. As best shown in FIG. 15, an eccentric bearing 200 is secured to each end portion of bearing mount 199. Bearing mount 199 and bearings 200 are flanked by the end walls 202, 203 of a valve carriage 204 (FIG. 16).

Control rod 51 is freely received by an aperture in each end wall 202, 203, of valve carriage 204 (FIG. 17). As best seen in FIGS. 16–21 valve carriage 204 comprises a framelike member having a pair of sector plates 206, 207 mounted on opposite sidewalls thereof. A pair of helical springs 209, 210 are arranged along the circular contour of opposite sector plates 206, 207, each spring being secured at opposite ends to the outer surface of a gate valve 211 by means of cap screws 212. A plurality of cap screws 213 received in mounting bores 214 in carriage 204 are threaded into corresponding threaded bores in gate valve 211. As best shown in FIG. 20, cap screws 213 are adjusted to a predetermined depth to provide a predetermined amount of free-play between gate valve 211 and carriage 204. Gate valve 211 comprises a generally flat valve member having a peripheral groove and seal 216 for providing a fluid tight joint with the outer surface of stage 12.

The gate assembly is operated in the following manner. With valve 211 originally in the open position, control rod 51 is manipulated to the left as viewed in FIGS. 13 and 14 until the free end thereof is located on bearing support 197 as shown. In this position, gate valve 211 is drawn to carriage 204 by springs 209, 210 as shown in FIGS. 18 and 20. Control rod 51 is then manually rotated. As eccentrics 200 rotate with rod 51 and increasingly bear against the outer surface of gate valve 211, gate valve 211 and carriage 204 are forced apart until valve 211 is in the full sealing position illustrated in FIGS. 19 and 21 in which seal 216 is tightly urged against the outer surface of stage door 12. It is noted that the amount of spatial separation between carriage 204 and gate valve 211 is controlled by the free-play of cap screws 213 in mounting bores 214.

To open, control rod 51 is rotated in the opposite direction, thereby enabling springs 209, 210 to draw carriage 204 and gate valve 211 together to unseat valve 211 from the outer surface of stage 12. Control rod 51 is then manually withdrawn to the right until access aperture 13 in stage door 12 is completely exposed.

The above described apparatus may be utilized to load and unload specimens in the main SEM chamber 11 in the following fashion. Specimen shuttle 49 is attached to the threaded end 72 of shuttle control rod 71. As the threaded end 72 of control rod 71 advances into threaded bore 147 in front wall 146 of specimen shuttle base 110, low friction wheels 140, 141 are retracted to the partially extended position shown in phantom in FIG. 7. It is noted that wheels 140, 141, when in the partially extended position, are free to rotate about their respective spindles 138, 139 so that shuttle 49 may be easily wheeled along the several support surfaces encountered in transit. Airlock housing 53 with closure plug 61 installed is then fitted over the entrance flange 52 with shoulder 55 snugly against seal 56, and set screw is tightened. Pump 79 is actuated and valve assembly 76 is adjusted to the backfill setting to provide an inert atmosphere within airlock chamber 65.

The specimen is now placed on dished surface 151 of specimen cap 116 and the specimen manipulator 153 is maneuvered so that the jaws of collet 156 grasp specimen cap 116 with pin 152 engaged in one of the collet slots 158. Closure cap 61 is next removed from airlock housing 53 and the lower end of specimen manipulator 153 is inserted into access aperture 62 in the top of housing 53 as shown in FIG. 22, until specimen cap 116 is positioned above threaded boss 115 of specimen shuttle 49. Specimen cap 116 is now secured to threaded boss 115 by manually rotating specimen manipulator 153 in the clockwise direction. Specimen manipulator 153 is next withdrawn from airlock housing 53 and closure plug 61 is reinstalled to the sealing position shown in FIG. 4.

With the specimen and cap 116 mounted on specimen shuttle 49, backfill of chamber 65 is terminated and main SEM chamber 11 and airlock chamber 65 are next evacuated by vacuum pump 75. This may be done in alternate ways. Gate valve 211 can be retracted by manually withdrawing gate valve control rod 51 until access aperture 13 is exposed, after which both chambers may bessimultaneously pumped down by vacuum pump 75. Alternatively, compound valve 76 may be adjusted to provide parallel connection between pump 75 and vacuum lines 77, 78, and gate valve 211 may be retained in the closed position whil simultaneously pumping down both chambers via parallel conduits 77, 78.

After pressure in chambers 11, 65 has been reduced to a desired level, gate valve 211 is opened, (if previously closed) and specimen shuttle 49 is manipulated into main chamber 11 by means of shuttle control rod 71, and onto platform 90 between gibs 92, 93. Specimen shuttle control rod 71 is next removed by manual rotation in the counter-clockwise direction, thereby permitting wheels 140, 141 to be extended by springs 142, 143 to the rigid position depicted in FIGS. 5–8. Thereafter, gate valve 211 is closed to isolate main SEM chamber 11 from airlock chamber 65. The specimen is now ready for inspection by the SEM electron beam. During inspection of the specimen, if desired, airlock housing 53 may be removed by venting airlock chamber 65 to atmospheric pressure with compound valve 76, unfastening set screw 58 and withdrawing airlock housing 53.

To operate with a frozen specimen, Dewar tank 16 is first filled with a cooling fluid, and specimen shuttle 49 is installed in mounting platform 90 in the above-described manner. As upper plate 113 of shuttle 49 makes contact with abutment member 87, the specimen cap mounting plate 113 is cooled by the cooling fluid in Dewar tank 16 via conducting strap 41. If desired, gate valve 211 may be manually translated to the closed position at this time, and main SEM chamber 11 may be pumped down by pump 75 during the period of time required to cool mounting plate 113.

After the specimen cap mounting plate 113 has cooled to the requisite temperature, gate valve 211 is opened and shuttle control rod 71 is reinserted into threaded bore 147 in specimen shuttle 49, thereby retracting wheels 140, 141 to the partially extended position, and specimen shuttle 49 is withdrawn into airlock chamber 65. Thereafter, gate valve 211 is closed to isolate main SEM chamber 11 from airlock chamber 65. Compound valve 76 is now adjusted to the backfill position in which airlock chamber 65 is pressurized to ambient pressure, preferably with an inert gas.

The specimen cap 116 is now grasped by specimen manipulator 153 with outer shield 163 in the retracted position shown in FIG. 11. The lower end of specimen manipulator 153 is inserted into Dewar tank 116 and submerged in the cooling fluid located therein for a period of time sufficient to bring the mounted specimen to the desired low temperature (typically a few seconds). Outer shield 163 is then drawn downwardly to the position shown in FIG. 12 to trap a pool of cooling fluid above specimen receiving surface 151 of specimen cap 116. With the shield arranged in this position, the manipulator is removed from Dewar tank 16 and manually transferred over to air lock housing 53. Closure plug 61 is removed, and specimen cap 116 is next attached to mounting plate 113 of specimen shuttle 49 in the manner described above. After specimen manipulator 153 has been withdrawn from airlock housing 53 and closure plug 61 has been reinstalled, airlock chamber 65 is evacuated, gate valve 211 is opened and shuttle 49 is installed on platform 90 in the usual way. Control rod 71 is then withdrawn and gate valve 211 is closed. Inspection of the specimen may now proceed. During inspection, the thermal path described above between specimen cap 116 and Dewar tank 16 maintains the specimen at the desired low temperature.

After inspection of a given specimen has been completed, specimen shuttle 49 may be withdrawn from main SEM chamber 11 into airlock chamber 65 and removed from specimen shuttle 49 in the usual way. A fresh specimen may next be installed onto shuttle 49 and transferred to main SEM chamber 11 for inspection. It is noted that this may be accomplished without disturbing the vacuum in SEM chamber 11 by proper manipulation of gate valve 211. In this way, several specimens may be successively transferred to and from main SEM chamber 11 and inspection of each fresh specimen may proceed immediately.

FIGS. 23–31 illustrate a specimen coating apparatus which may be conveniently employed to provide an electrically conductive coating for a specimen prior to installation in main SEM chamber 11 and which also functions as an airlock chamber to facilitate specimen transfer to and from main SEM chamber 11. With reference to FIGS. 23–26, a housing 220 has a rear wall provided with an opening 221 sized to accomodate entrance flange 52. The inner wall surface defining opening 221 is provided with a stepped shoulder 222 for the same purpose as shoulder 55 of airlock housing 53. Housing 220 is further provided with a control panel 223 having a pair of on-off switches 225, 226 labeled FILAMENT and MOTOR, respectively, for enabling the application of electrical power to a filament and a motor as described below. In addition, a control knob 227 is provided which is coupled to a variable resistance mounted within housing 220 which affords manual adjustment of the amount of electrical current supplied to the filament. Filament power is provided by means of a cable 228; electrical power is provided to the motor by means of a male plug 229 adapted to receive a mating plug (not shown) which is coupled to a suitable source.

A cover member 230, preferably constructed from a transparent material, is connected to housing 220 by means of a pair of hinges 231. As best shown in FIG. 26, cover mamber 230 is provided with a peripheral seal 232 along the angled lower edge thereof. When cover member 230 is closed, seal 232 forms a vacuum tight joint with the underlying angled upper surface of housing 220 to define an airlock chamber 233. Cover member 230 is also provided with a closure plug 234 having a seal 235 for a purpose similar to closure plug 61 and seal 63. Secured to the rear wall of cover member 230 are a pair of electrically conductive contact blades 237 which engage a pair of blade receptacles 238 when cover member 230 is closed. Receptacles 238 are mounted on an insulating block 239 secured to the upper rear surface of housing 220. Receptacles 238 are electrically coupled to cable 228 by means of conductive leads 240 secured to the individual receptacles 238 by means of fastening screws 241.

A control rod bearing assembly 70 is mounted in a bore in the front wall of housing 220 and provides a sealed bearing mount for a shuttle control rod 71.

As best shown in FIG. 27, shuttle platform 244 having a pair of laterally spaced substantially parallel gibs 245, 246 similar to gibs 92, 93 is rotatably mounted within coating chamber 233 by means of a shaft 248 and a conventional sealed bearing assembly 250 mounted in a bore in the lower wall 251 of housing 220. Secured to the lower end of shaft 248 is a driven gear 253 which meshes with an intermediate gear 254. Intermediate gear 254 is driven by a driving gear 255 mounted on the output shaft of a motor (not shown) located within housing 220. Secured to shaft 248 immediately below platform 244 is a driving gear 257 providing power take-off to a pair of filament driving gears 264 via a conventional drive train 258, 261 and 262. Filament driving gears 264 are interconnected by means of a rotatable shaft 265. As best shown in FIG. 28, each filament assembly drive gear 264 is rotatably secured to a mounting bracket 266 anchored to lower housing wall 251. A link arm 267 pinned to gear 264 at the lower end thereof and restricted to sliding motion by a fixed stationary guide pin 268 received in a guide slot 269 provides a lifting force for filament assembly 270 via camming surface 271.

With reference to FIGS. 26, 28 and 29, filament assembly 270 comprises a pair of spaced parallel arms 272 fabricated from an electrically conductive material and having inwardly extending flanges 273 secured to an electrically insulative spacer bar 274 by means of fastening screws 275. Secured to each arm 274 is an outwardly extending lifting peg 276 and a pair of outwardly directed trunnion members 277 each having a head portion 278 located inwardly of arms 272. Head portions 278 are provided to guide a pair of flexible conductors 280 each having a terminal lug 281 secured to arm 272 by means of screws 282. The distal end of conductors 286 are each connected to the inner end of blades 237 by suitable fasteners.

In the embodiment illustrated in FIG. 28, a pair of facing, spaced hollow cylindrical members 285 are secured to arms 272 at the filament end thereof by any suitable means, e.g. brazing. Received within each cylindrical member 285 is a conductive rod 286 having a threaded outer end and an inner end having a cross bore. Each end of a hairpin filament 288 is received in a different one of these cross bores. Filament 288 is held in place by means of a pair of nuts 289 which are threaded onto the outer end of shafts 286 and tightened to withdraw shafts 286 until the ends of filament 288 bear against the open ends of cylindrical members 285.

FIG. 30 shows an alternate filament assembly employing a pair of carbon rods 290, 291. Rod 290 is secured in an electrically conductive tubular member 291 which is received within a second electrically conductive tubular member 292. Member 292 is secured to arm 272 by any suitable technique, e.g., brazing. An adjustment screw 293 enables the adjustment of the lateral position of rod 290. Carbon rod 291 is received in a bore in a mounting member 295 secured to arm 272. Rod 291 is biased toward rod 290 by means of a small spring 296. The inner end portion of rod 291 is narrowed as shown to provide a suitable contact area with the face of rod 290. Electrical connection to rod 291 is afforded by means of a clamp 298 and securing screw 299.

Both filament embodiments are provided with a cylindrical shield 300 shown in FIG. 31 having friction pins 301 removably received in socket 302 carried by a socket plate 303. Socket plate 303 is mounted to spacer bar 274 by means of mounting screws 305.

To install filament assembly 270, the free ends of arms 272 are bent inwardly, and trunnion members 277 are fitted into receiving bores in the inner sidewalls of cover member 230. When installed, filament assembly 270 is thru pivotally secured to cover member 230. Removal is accomplished in the reverse manner.

With reference to FIGS. 24–26, a fixed shield plate 310 is secured to lower housing wall 251 by means of pedestal 311 and screws 312. A moveable shield plate 314 having an upturned flange 315 is coupled via an arm 316 to the inner end of a rotatable shaft 317. Shaft 317 is carried by a conventional sealed bearing assembly 318 mounted to housing 220 and is provided with a control knob 320 on the outer end thereof. Moveable shield plate 314 may thus be raised or lowered by rotating knob 320. A stop tab 321 formed on arm 316 overlies a portion of fixed shield plate 310 in order to restrict the downward movement of plate 314.

Shield plates 310, 314 are provided with mating semi-circular cut-out portions dimensioned to accomodate a specimen cap 116. Thus, when a cap 116 is mounted in chamber 233 in the manner described below, the surface of the cap 116 is exposed to material for deposition from above, while plates 310, 314 shield the shuttle from the deposition material.

The specimen coating apparatus described above may be employed to deposit several suitable electrically conductive coating materials on the surface of a non-conductive specimen. The hairpin filament illustrated in FIG. 29 is suitable for depositing gold, aluminum, palladium and like materials. To prepare the filament for the coating process, a ribbon of the desired coating material is wrapped about the looped portion of filament 288, after which shield 300 is installed. The carbon filament illustrated in FIG. 30 is employed as shown without further preparation.

After filament selection and preparation, filament assembly 270 is then mounted in cover member 230, and the cover is closed. A specimen shuttle is next attached to the inner end of control rod 71, manipulated onto platform 244 between gibs 245, 246 and locked in place by withdrawing the inner end of control rod 71.

Opening 221 is next fitted onto flange 52 with flange seal 56 snugly against shoulder 222. Closure cap 234 is then removed and a specimen cap 116 bearing a frozen or unfrozen specimen is secured to shuttle 49 in the usual way. Closure cap 234 is replaced and chamber 233 has been evacuated by pump 75. After chamber 233 has been evacuated, power is applied to the filament and the motor and the filament current is adjusted to provide the desired rate of coating material evaporation and deposition.

Actuation of the motor causes platform 24 to rotate, thereby rotating shuttle 49 and the specimen mounted thereon. In addition, filament assembly 290 is rocked back and forth by link arms 266 about the pivot points provided by trunnions 277. It is noted that the center of rotation of the arcuate movement of filament assembly 270 is just above the surface of shields 310, 314. This point is approximately located at the surface of the specimen when positioned in a cap 116 and mounted on a shuttle 49. The combined rotary movement of the specimen and the oscillatory motion of the filament along an arcuate path ensures substantially uniform coating of the specimen surface with the coating material. Preferably, the gear train arrangement should be selected so that the motion of filament assembly 270 is aperiodic with respect to the rotation of the specimen.

After coating of the specimen has been completed, filament and motor power is terminated and control rod 71 is secured to specimen shuttle 49. Moveable shield plate 314 is raised by rotating knob 320 and shuttle 49 is inserted into the main SEM chamber 11 in the usual way. The coated specimen is now ready for inspection. If desired, housing 220 may be removed during inspection of the specimen and airlock housing 53 may be attached to stage 12. Alternatively, housing 220 may be left in position throughout the inspection and removal process, particularly if a series of non-conductive specimens are to be first coated and then inspected.

As will now be apparent, the above described apparatus provides an extremely great degree of flexibility in coating and transferring frozen or unfrozen specimens between main SEM chamber 11, the airlock chamber and the external environment. For example, an unfrozen specimen may be transferred into main SEM chamber 11 via either airlock chamber and subjected to a first inspection. Thereafter, the specimen may be transferred to the airlock chamber in the coating apparatus, provided with a coating of conductive material and re-transferred to main SEM chamber 11 for a subsequent inspection. If deemed desirable, the specimen may be frozen at any stage of the process in the simple manner described above and re-transferred to the main SEM chamber 11. Moreover, a succession of different specimens may be also serially installed in main SEM chamber 11 in a quick and efficient manner. Most importantly, all transfer operations can be performed without disturbing the environment in main SEM chamber 11, thereby minimizing the transfer time interval.

While the foregoing provides a complete and adequate disclosure of the preferred embodiments of the invention, various modifications alternate constructions and equivalents may be employed without departing from the true spirit and scope of the invention. For example, if desired the above described coating apparatus may be provided with a sputtering device for coating specimens. Accordingly the above description and illustrations should not be construed as limiting the scope of the invention which is defined by the appended claims.

What is claimed is:

1. A moveable specimen shuttle for facilitating transfer of a specimen carried by a detachable specimen cap to the interior of an SEM chamber, said chamber including a platform having a pair of mounting surfaces, said shuttle comprising:
    a base member having a spaced pair of angled shoulder surfaces adapted to be engaged with said pair of mounting surfaces of said platform;
    an upper member having means for securing a specimen cap thereto;
    means for supporting said upper member above said base member; and
    adjustable support means mounted in said base member for providing low friction sliding support for said shuttle when in a first operative position in which said shuttle can be transferred to and from said chamber and for elevating said base member to a position of engagement with said mounting surfaces when in a second operative position in which said shuttle is secured within said chamber with said angled shoulder surfaces in contact with said mounting surfaces.

2. The apparatus of claim 1 wherein said upper member is fabricated from a material having high thermal conductivity and said first means includes a support plate fabricated from a material having low thermal conductivity and coupled to said upper member.

3. The apparatus of claim 1 wherein said base member includes a pair of longitudinally extending ramps inclined upwardly in the rearward direction of said base member and said adjustable support means comprises a yoke having a pair of laterally extending arms and a pair of oppositely directed spindles spaced longitudinally from said arms, a pair of wheels each mounted on a different one of said spindles in surface contact with a difference one of said ramps, means for normally biasing said wheels in the forward direction of said base member to said engagement position, and means adapted to be engaged by a control member for enabling said wheels to be biased in the rearward direction of said base member to said first operative position.

4. For use in transferring a specimen mounted on a specimen cap to a specimen shuttle having means for detachably mounting said specimen cap thereto, said shuttle facilitating transfer of said specimen to an SEM chamber, a specimen manipulator comprising:
    an inner tubular member having an axial bore and a lower end terminating in an expandable collet;
    said collet having an interior configuration adapted to grasp said specimen cap;
    an outer shield slideably disposed about the outer surface of said inner tubular member, said shield having a lower end for enclosing said collet to define an enclosed volume above said specimen cap when in a closed position;
    a release rod slideably received within said bore; and
    a camming block mounted on the lower end of said release rod, said camming block having an outer surface adapted to expand said collet when said rod is translated along said axial bore toward the lower end thereof and said shield is retracted to an open position.

5. The apparatus of claim 4 wherein said collet has an inner abutment shoulder and said camming block has a frusto-conical shape with the outer surface tapering inwardly in the downward direction.

6. The apparatus of claim 3 wherein said means for enabling said wheels to be biased in the rearward direction of said base member includes a front yoke surface defined by said pair of laterally extending yoke arms and a threaded aperture formed in said base member adjacent said front yoke surface and adapted to receive a threaded end of said control member.

* * * * *